United States Patent [19]
Quill et al.

[11] Patent Number: 5,446,303
[45] Date of Patent: Aug. 29, 1995

[54] FAULT-PROTECTED OVERVOLTAGE SWITCH WITH EXPANDED SIGNAL RANGE

[75] Inventors: John Quill; Frank Poucher, both of Limerick, Ireland

[73] Assignee: Analog Devices, Incorporated, Norwood, Mass.

[21] Appl. No.: 301,256

[22] Filed: Sep. 6, 1994

Related U.S. Application Data

[63] Continuation-in-part of Ser. No. 227,727, Apr. 14, 1994, Pat. No. 5,389,811.

[51] Int. Cl.$^6$ ............... H01L 27/02; H01L 29/06; H01L 29/78
[52] U.S. Cl. ............... 257/360; 257/357; 257/372; 257/374
[58] Field of Search ............... 257/357, 360, 372, 374

[56] References Cited

U.S. PATENT DOCUMENTS 5,389,811  2/1995  Poucher et al. ............... 257/360

Primary Examiner—Ngân V. Ngô
Attorney, Agent, or Firm—Parmelee, Bollinger & Bramblett

[57] ABSTRACT

An integrated-circuit (IC) chip formed with a fault-protected switch comprising three MOS transistors in series. An additional MOS transistor is formed adjacent the center one of the three transistors, and is arranged such that the gates of the two transistors are connected together, the source electrodes of the two transistors are connected together, the backgates form a common region, and the drain of the additional transistor is connected to those backgates.

5 Claims, 5 Drawing Sheets

FAULT-PROTECTED OVERVOLTAGE SWITCH WITH EXPANDED SIGNAL RANGE

This is a continuation-in-part of parent application Ser. No. 08/227,727 filed by the present inventors on Apr. 14, 1994 now U.S. Pat. No. 5,389,811, issued on Feb. 14, 1995.

BACKGROUND OF THE INVENTION

1. Field of the Invention

This invention relates to integrated-circuit (IC) chips having semiconductive switches such as might be used in multiplexers to connect any one of a number of inputs to an output. More particularly, this invention relates to so-called fault-protected overvoltage switches.

2. Description of the Prior Art

Fault-protected overvoltage switches have been provided commercially for some time. Such switches typically are arranged to open automatically if an excessive voltage is applied to the switch input (or the output in some cases), thereby preventing the overvoltage from reaching and damaging a device to which the switch is connected. Commonly, such switches comprise a number of series-connected MOSFET transistors. For example, they may include an N-channel MOSFET, a P-channel MOSFET, and another N-channel MOSFET, in that order.

One such three-transistor circuit is described in co-pending application Ser. No. 08/227,727, filed by the present inventors on Apr. 14, 1994. In that device, each transistor is placed in a corresponding tub of the IC chip. Each of these tubs is electrically isolated from all other sections of the IC chip, so that the MOS transistors are isolated from one another and from the chip voltage supplies. Although that device performs satisfactorily in most respects, its operating voltage range is somewhat less than desired due to body effect in the P-channel transistor.

SUMMARY OF THE INVENTION

In a preferred embodiment of the present invention, to be described hereinbelow in detail, an improved fault-protected switch is provided having an expanded input voltage operating range. This increase in operating range is achieved in the preferred embodiment by employing an additional MOS transistor connected to the center transistor of a three-transistor series-connected switch. This added transistor serves as a follower to limit the voltage drop across the center transistor. In the described embodiment, the operating range is thereby increased from $-11.5$ v to $+13.5$ v to: $-13.5$ v to $+13.5$ v, an increase in range of 2 volts.

DETAILED DESCRIPTION OF A PREFERRED EMBODIMENT

Figure 1:
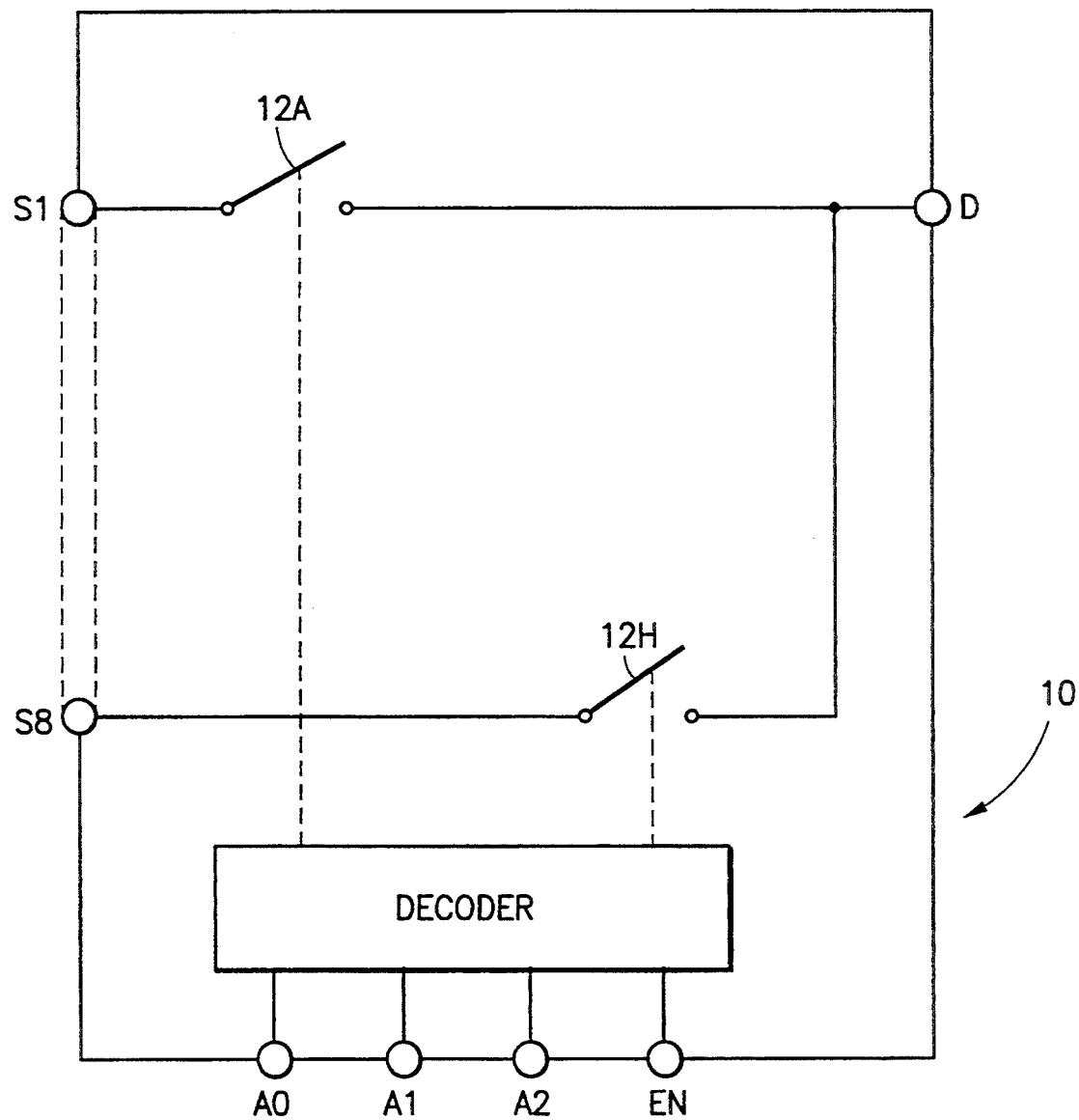
FIG. 1 is a block diagram illustration of a multiplexer known in the art.

Referring now to FIG. 1, there is shown in block diagram format a commercially available type of multiplexer 10 forming part of an IC chip. This FIG. 1 is identical to FIG. 1 in the above-identified parent application. The device shown includes eight switch input terminals S1–S8, each connected to one input of a corresponding switch 12A–12H. The output terminals of these switches are all connected together to a single output D.

The switches 12A–12H are turned on or off (i.e., closed or opened) by conventional logic circuitry within the chip (not shown). This logic circuitry responds to a digital code signal applied to pins A0, A1, A2. An enable terminal EN is provided, and supply voltages are connected to the chip through terminals which are not shown. Only one switch 12A, 12B, etc., . . . is turned on at a time, as determined by the applied digital code signal A0, A1, A2.

Figure 2:
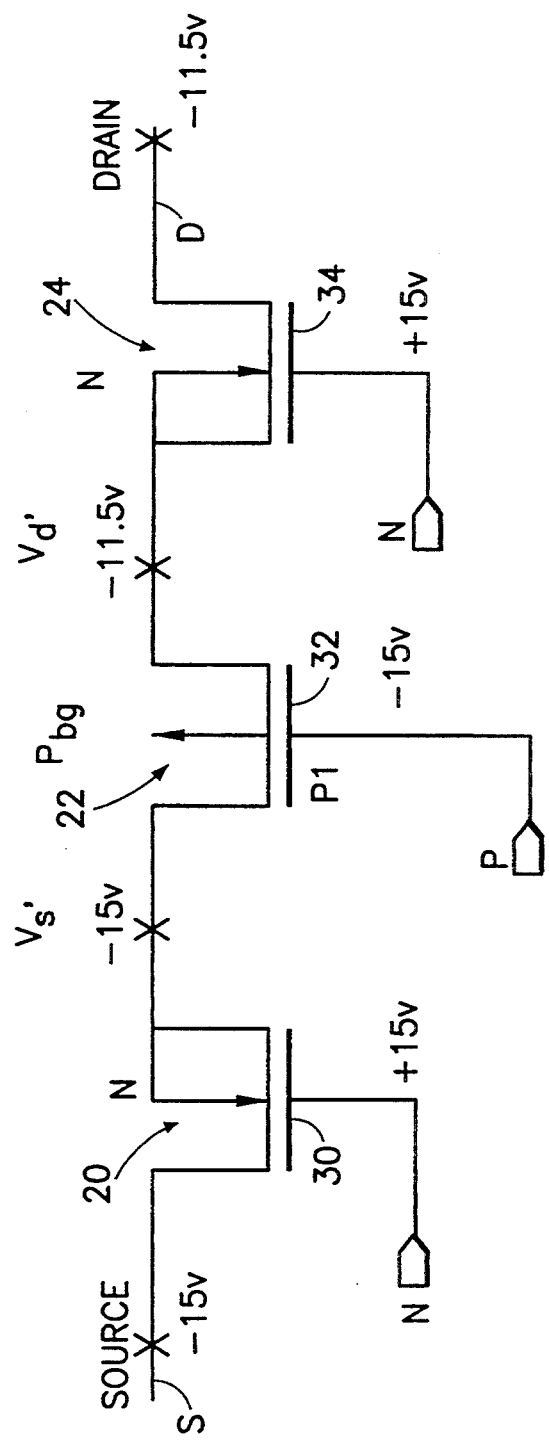
FIG. 2 is a diagram showing a switch as disclosed in the above-identified parent application Ser. No. 08/227,727.

FIG. 2 is a simplified circuit diagram of one of the switches 12A–12H as disclosed in the above-identified parent application. The switch includes three series-connected MOS transistors 20, 22 and 24. The first and third transistors are N-channel MOSFETs and the middle transistor is P-channel. The switch input terminal S is connected to the source electrode of the first N-channel MOS transistor 20. The drain electrode of this transistor is connected to the transistor backgate (or "bulk") and to the source electrode of the following P-channel MOSFET 22. The backgate of this transistor is floating in the configuration of the above parent application. Its drain electrode is connected to the source electrode and backgate of the third transistor 24. The drain electrode of this transistor is in turn connected to the switch output terminal D.

The gate electrodes 30, 34 of the N-channel MOSFETs 20, 24 are connected together to a common control signal terminal N. The P-channel gate electrode 32 similarly is connected to a control signal terminal P. The signals on these control terminals are determined by logic circuitry in the chip responding to the applied digital code A0, A1, A2. The logic signals select one of the digital switches in the multiplexer 10 to be turned on.

These N and P control signals are either $+15$ volts or $-15$ volts, derived from the chip supply voltages. The N and P control signals are complementary, such that when one is $+15$ volts, the other is $-15$ volts. When the N control signal is $+15$ volts (as shown in FIG. 2), the N-channel transistors 20, 24 are turned on. The P terminal will at that time be $-15$ volts, and this voltage on the gate electrode 32 of the P-channel transistor 22 will turn that transistor on. Thus, all three transistors are turned on, and the switch is "closed", meaning that an input signal can be transmitted from the input S to the output D.

When as shown in FIG. 2 the voltage at the input terminal S (identified herein as $V_s$) is brought negative to $-15$ volts or lower (the negative end of the signal range), the output voltage at terminal D (identified herein as $V_d$) will only go to −11.5 volts. This is because a threshold voltage of the P-channel transistor 22 is developed across that transistor before it goes OFF. This occurs at a P-channel threshold voltage ($V_{tp}$) below the gate voltage. This $V_{tp}$ value depends on the voltage difference between the gate and the backgate and is known as the body effect on the threshold. In the case of FIG. 2 as described above, there is 30 volts across the gate oxide which results in a $V_{tp}$ of $>3$ volts. The drain of the P-channel ($V_d'$) will be at −11.5 volts. The drain of the following N-channel transistor 24 will also be −11.5 volts, providing the output voltage at D.

With the FIG. 2 switch arrangement, the voltage range is restricted at the negative end. The same restriction does not occur when $V_s$ is brought positive close to its turn-off point. Since the source and backgate of each N-channel transistor are connected together, the N channel threshold $V_{tn}$ does not increase, and the full positive signal range can be obtained.

Accordingly, it will be seen that the signal range is determined by the P-channel $V_{tp}$ at the negative end and by the N-channel $V_{tn}$ at the positive end of the operating range.

The body-effect of the P-channel transistor 22 when turned on can be minimized by reducing the voltage between its gate and backgate. It has been found that this result can be effected by causing the backgate voltage ($P_{bg}$) to follow $V_s'$ when the switch is on, while assuring that the part will pass fault protection conditions when the switch is on or off.

Figure 3:
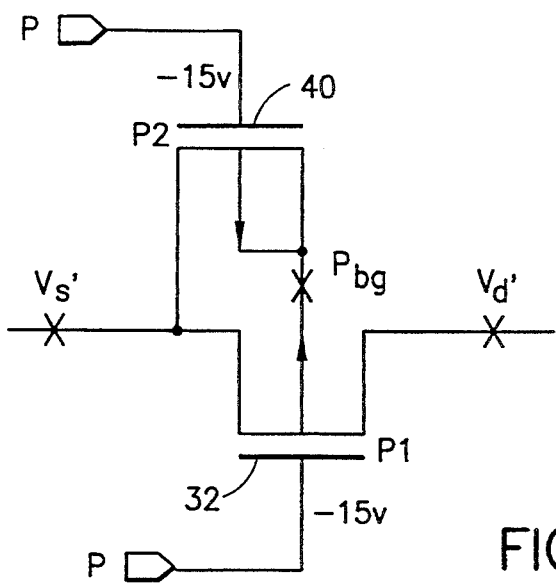
FIG. 3 is a diagram showing the modification made to the switch shown in FIG. 2 in accordance with this invention, wherein an additional P-channel transistor is connected to the center P-channel transistor of the FIG. 2 switch.

Referring now to FIG. 3, this is achieved in the preferred embodiment by forming on the IC chip an additional P-channel transistor P2 which is interconnected with the center P-channel transistor P1. The interconnections provide that the transistor gates 32 and 40 are connected in common to the positive control signal terminal P, that the transistor source electrodes are connected together, and that the two transistors P1, P2 have a common backgate region $P_{bg}$ to which the drain of P2 is connected. This arrangement assures that $P_{bg}$ will stay within a P-channel threshold of $V_s'$.

With both P-channel transistors driven from the same node, both will be ON or OFF simultaneously. If $V_s'$ is −15 v or lower, with both P1 and P2 ON, $P_{bg}$ will go to −13.5 v, given that $V_{tp}$ is approximately 1.5 volts. With $P_{bg}$ of P1 equal to −13.5 volts, its body effect is at a minimum. The threshold $V_{tp}=1.5$ volts allows the output $V_d'$ to also go to −13.5 volts, thereby achieving the desired expansion in operating range.

The three-transistor (N-P-N) switch with this additional P-channel transistor will still behave as before for overvoltages when the switch is OFF. That is, there will be no leakage current for voltages up to the overvoltage limits. Also, the switch will still turn OFF whenever $V_s$ or $V_d$ exceeds the signal range voltage limits.

Figure 4:
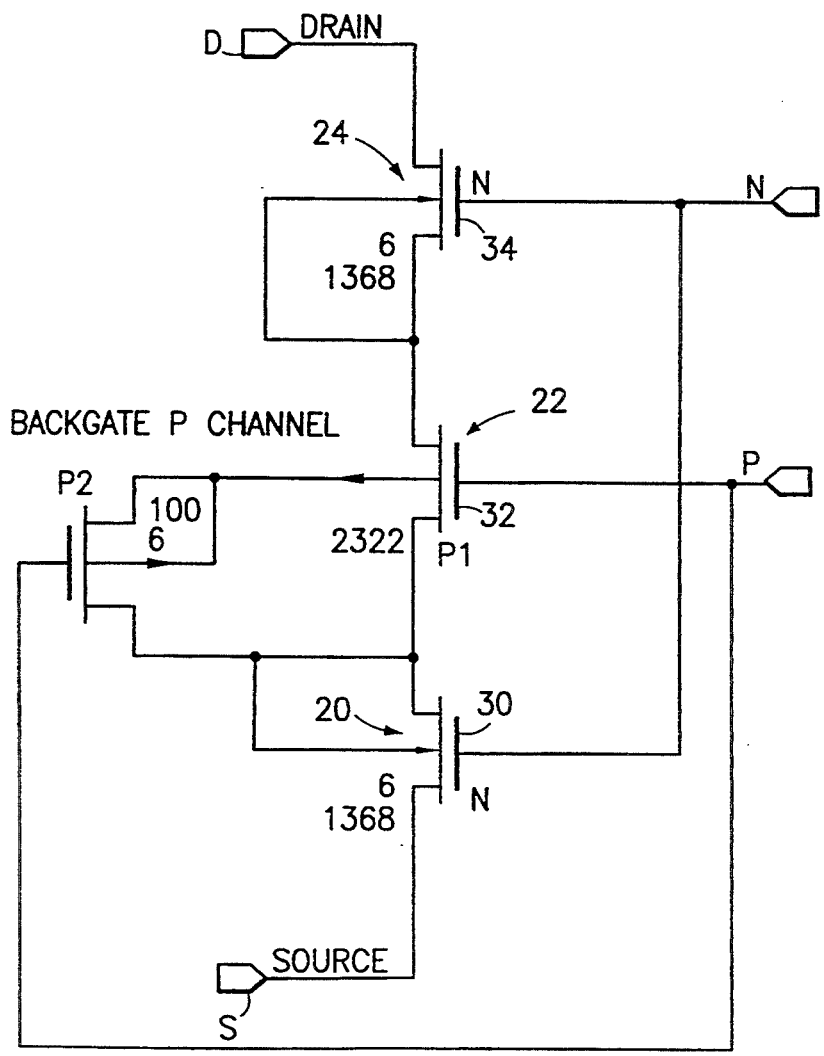
FIG. 4 is a circuit diagram of the basic switch elements of the preferred embodiment of the invention.
Figure 5:
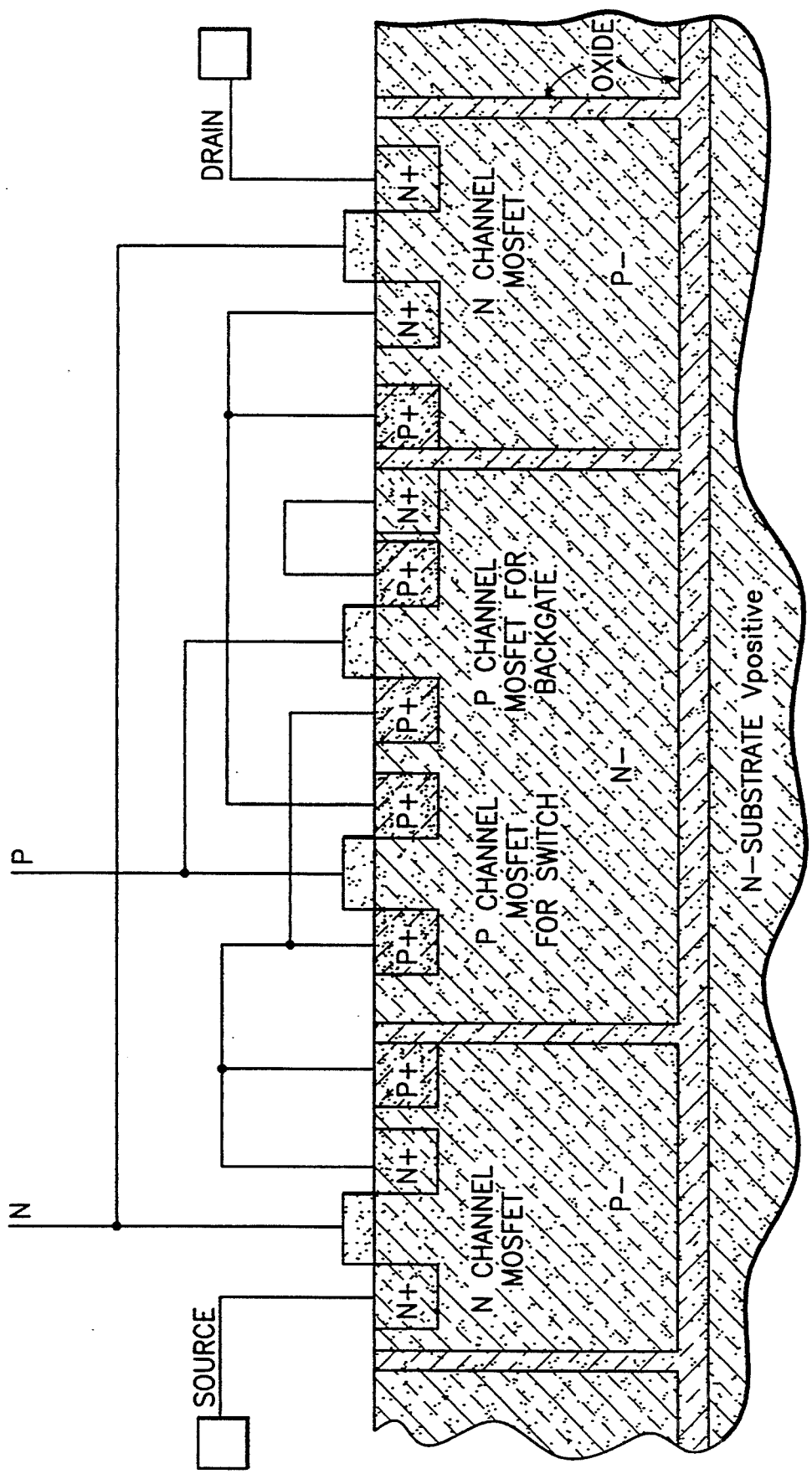
FIG. 5 is a section view sketch of an IC chip segment (not to scale) illustrating the physical configuration of the switch of FIG. 4.
Figure 6:
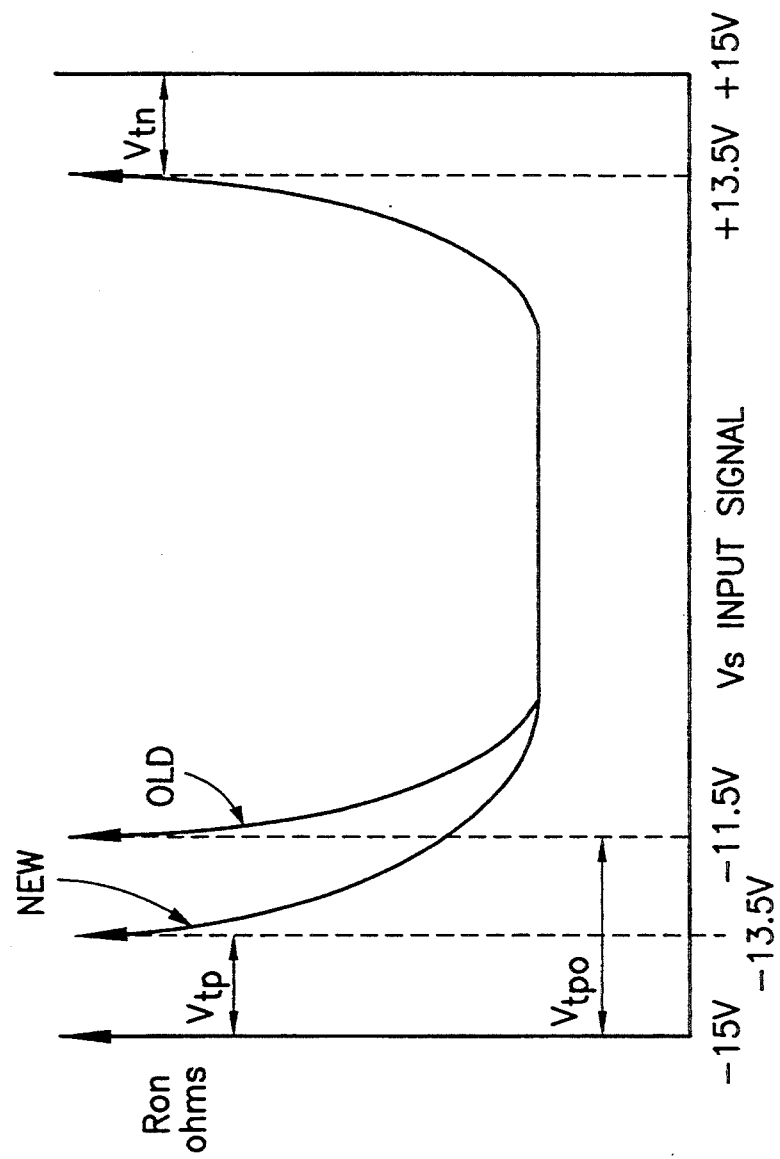
FIG. 6 is a graph showing how the operating voltage range is extended by employing the switch of FIGS. 4 and 5, as compared to the switch of FIG. 2.

FIG. 4 presents a circuit diagram showing the basic elements of the switch, including the series-connected (N-P-N) MOS transistors and the additional P-channel transistor. FIG. 5 presents a cross-section view illustrating the chip regions and the interconnections. FIG. 6 is a graph showing the operating characteristics for the new design as compared to the original design described in the above-identified parent application.

Although a preferred embodiment of the invention has been disclosed herein in detail, it is to be understood that this is for the purpose of illustrating the invention, and should not be construed as necessarily limiting the scope of the invention. For example, the invention can be used with a trench isolation process as described in the above-identified parent application, where access to the backgate of the P-channel is possible, or with a standard N-well process where the backgate of the P-channel is isolated. It is apparent that many changes can be made by those skilled in the art while still practicing the invention claimed herein.

What is claimed is:

1. An integrated-circuit (IC) chip formed with a switch having input and output terminals and for use in applications where overvoltage conditions can cause damage to a device to which the switch is connected;;
said IC chip comprising:
semiconductive material formed with a plurality of MOS transistors each having two current-carrying electrodes and a gate electrode, said current-carrying electrodes serving as the switch input and output terminals and being connected in series sequence;
said series-connected transistors including at least an N-channel transistor and at least a P-channel transistor;
an additional MOS transistor having two current-carrying electrodes and a gate electrode, said additional transistor being formed in said IC chip and interconnected with one of said series-connected transistors in such fashion that the backgates of those transistors are common, the gate electrodes are connected together, and a current-carrying electrode of said one transistor is connected to a current-carrying electrode of said additional transistor to reduce the voltage between the gate and the backgate of said one transistor;
control terminal means connected to the gates of said series-connected transistors for applying control signals thereto for turning off and on said series-connected transistors to open and close the circuit through such transistors; and
means operable, when said series-connected transistors are in "on" state and an overvoltage is applied to said input terminal, for turning off at least one of said series-connected transistors when the applied voltage reaches a predetermined overvoltage level.

2. An IC chip as in claim 1, wherein there are three series-connected transistors;
said additional transistor being connected to the center transistor of said three transistors.

3. An IC chip as in claim 2, wherein said center transistor is a P-channel transistor and the remaining two of said series-connected transistors are N-channel.

4. An IC chip as in claim 3, wherein for said center transistor the voltage of the backgate is less than the voltage of the gate by an amount equal to a threshold voltage $V_{tp}$ of the transistor, when the transistor is ON.

5. An IC chip as in claim 4, wherein $V_{tp}$ is approximately equal to 1.5 volts.

* * * * *